US008174865B2

(12) United States Patent
Rhie et al.

(10) Patent No.: US 8,174,865 B2
(45) Date of Patent: May 8, 2012

(54) MEMORY DEVICES AND WIRELESS DEVICES INCLUDING THE SAME

(75) Inventors: Hyoung-Seub Rhie, Gyeonggi-do (KR); Suk-Joo Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 191 days.

(21) Appl. No.: 12/707,871

(22) Filed: Feb. 18, 2010

(65) Prior Publication Data

US 2010/0208511 A1 Aug. 19, 2010

(30) Foreign Application Priority Data

Feb. 18, 2009 (KR) ........................ 10-2009-0013476

(51) Int. Cl.
*G11C 11/00* (2006.01)
(52) U.S. Cl. ................ 365/148; 365/189.07; 365/189.09
(58) Field of Classification Search .................. 365/148, 365/189.07, 189.09
See application file for complete search history.

(56) References Cited

U.S. PATENT DOCUMENTS

| 7,561,461 | B2 * | 7/2009 | Nagai et al. | .................... 365/148 |
| 2007/0296460 | A1 * | 12/2007 | Takigawa et al. | ................ 326/62 |
| 2009/0003087 | A1 * | 1/2009 | Doyle et al. | ............. 365/189.06 |
| 2009/0004575 | A1 * | 1/2009 | Kim | ................................ 430/5 |

FOREIGN PATENT DOCUMENTS

| JP | 2001-307494 | 11/2001 |
| JP | 2003-317466 | 11/2003 |
| KR | 10-0827448 | 4/2008 |

* cited by examiner

*Primary Examiner* — Son Dinh
*Assistant Examiner* — Nam Nguyen
(74) *Attorney, Agent, or Firm* — Myers Bigel Sibley & Sajovec

(57) ABSTRACT

A memory device includes a plurality of memory bit lines connected to a plurality of memory cells, a plurality of reference bit lines connected to a plurality of reference cells and a reference bit line selection circuit. The memory bit lines has a first pattern and a second pattern, and the first pattern has a first critical dimension (CD) distribution, and the second pattern has a second CD distribution. The reference bit lines have the first pattern and the second pattern. The reference bit line selection circuit provides a reference signal by selecting a reference bit line having a same pattern as a selected memory bit line connected to a memory cell to be read.

13 Claims, 8 Drawing Sheets

MEMORY DEVICES AND WIRELESS DEVICES INCLUDING THE SAME

CROSS-REFERENCE TO RELATED APPLICATIONS

This application claims priority under 35 USC §119 to Korean Patent Application No. 2009-0013476, filed on Feb. 18, 2009 in the Korean Intellectual Property Office (KIPO), the contents of which are herein incorporated by reference in their entirety as if set forth fully herein.

BACKGROUND

Embodiments of the present invention relate to reading data, and more particularly to memory devices and mobile devices including the same.

When reading data of a resistive memory device, extra reference bit lines may be connected to reference cells. When the extra reference bit lines are adopted, the reference cells and the reference bit lines may be formed through same processes as memory bit lines and memory cells are formed. Therefore, process variations may influence characteristics both of the memory cells and the reference cells. Particularly, the extra reference bit lines may be adopted by a Magnetoresistive Random Access Memory (MRAM), which may have a relatively small cell resistance and little difference of resistances corresponding to two different logic values.

When the extra reference bit lines are adopted, resistance matching between the memory bit line to be sensed and the reference bit line providing a reference may be necessary. Particularly, in case of the MRAM, which may have a relatively small cell resistance, when resistances of the memory cell and the memory bit line have little difference, sensing margins may be reduced due to a difference in the resistances of bit lines. When the bit lines are formed through a double patterning process, critical dimension (CD) distributions may be varied according to exposure processes of the double patterning process. When the CD distributions are varied, resistances of the bit lines may also be varied. Therefore, the sensing margin may be greatly reduced.

SUMMARY

Some embodiments of the present invention provide a memory device that includes multiple memory bit lines that are connected to multiple memory cells. The memory bit lines may have a first pattern and a second pattern such that the first pattern includes a first critical dimension (CD) distribution and the second pattern includes a second CD distribution that is different from the first CD distribution. Multiple reference bit lines may be connected to multiple reference cells. The reference bit lines may have the first pattern and the second pattern. The device may include a reference bit line selection circuit that is configured to provide a reference signal by selecting a reference bit line having a same pattern as a selected memory bit line connected to a memory cell to be read when a read operation is performed.

In some embodiments, the first pattern is formed through a first exposure process of a double patterning process and the second pattern is formed through a second exposure process of the double patterning process. Some embodiments provide that the first pattern is different from the second pattern. In some embodiments, each of the memory cells is set to have one of a first plurality of resistances, and each of the reference cells is set to have one of a second plurality of resistances. Some embodiments provide that the reference bit line selection circuit provides a current signal or a voltage signal as the reference signal. The current signal or the voltage signal may be generated based on a connection of the reference cells. In some embodiments, the current signal or the voltage signal has a value corresponding to an intermediate resistance between the resistances.

Some embodiments provide that the reference bit line selection circuit includes multiple transistors that selectively activate the reference bit line having the same pattern as the selected memory bit line connected to the memory cell to be read, in response to a bit line selection signal when the read operation is performed. In some embodiments, the transistors include a first transistor that activates the reference bit line having the same pattern as the selected memory bit line connected to the memory cell to be read to provide the reference signal, in response to the bit line selection signal. Some embodiments provide that the transistors include a second transistor that deactivates a reference bit line having a different pattern from the selected memory bit line connected to the memory cell to be read, in response to the bit line selection signal.

In some embodiments, the reference bit lines include a first reference bit line having the first pattern and a second reference bit line having the second pattern. Each of the first bit line and the second bit line is connected to at least four reference cells and each of the reference cells is set to have one of the plurality of resistances. Some embodiments provide that the at least four reference cells are connected such that an equivalent resistance of the at least four reference cells corresponds to a mean of the plurality of resistances when the read operation is performed. In some embodiments, the mean includes an arithmetical mean or a geometric mean.

Some embodiments include a sense amplifier that is configured to compare the reference signal with a cell signal corresponding to a data stored in the memory cell to be read. The cell signal may be provided as a current signal or a voltage signal when the read operation is performed.

Some embodiments of the present invention include a resistive memory device that includes a memory block that is configured to select one of multiple memory bit lines and that is configured to provide a cell signal corresponding to a logic value stored in a memory cell connected to the selected bit line. The memory bit lines may have a first pattern and a second pattern. The device includes a reference block that is configured to select a reference bit line having a same pattern as a selected memory bit line and that is configured to provide a reference signal based on a connection of a reference cells connected to the selected reference bit line. A sense amplifier is included that is configured to compare the cell signal with the reference signal and that is configured to determine the logic value stored in the memory cell.

In some embodiments, the first pattern has a first critical dimension (CD) distribution, the second pattern has a second CD distribution, and the first pattern is different from the second pattern.

Some embodiments of the present invention include a mobile device that includes an input/output interface that inputs/outputs data, a processor that processes the data, and a memory device. The memory device includes multiple memory bit lines, connected to multiple memory cells storing the data. The memory bit lines have a first pattern and a second pattern. The first pattern has a first critical dimension (CD) distribution, the second pattern has a second CD distribution that is different from the first CD distribution. The memory device includes multiple reference bit lines, connected to multiple reference cells. The reference bit lines have the first pattern and the second pattern. The memory device is configured to read the data by selecting a memory bit line and a reference bit line having a same pattern as the selected memory bit line connected to a memory cell to be read.

It is noted that aspects of the invention described with respect to one embodiment, may be incorporated in a different embodiment although not specifically described relative thereto. That is, all embodiments and/or features of any embodiment can be combined in any way and/or combination. These and other objects and/or aspects of the present invention are explained in detail in the specification set forth below.

BRIEF DESCRIPTION OF THE DRAWINGS

The accompanying figures are included to provide a further understanding of the present invention, and are incorporated in and constitute a part of this specification. The drawings illustrate some embodiments of the present invention and, together with the description, serve to explain principles of the present invention.

DETAILED DESCRIPTION OF THE EMBODIMENTS

Figure 1:
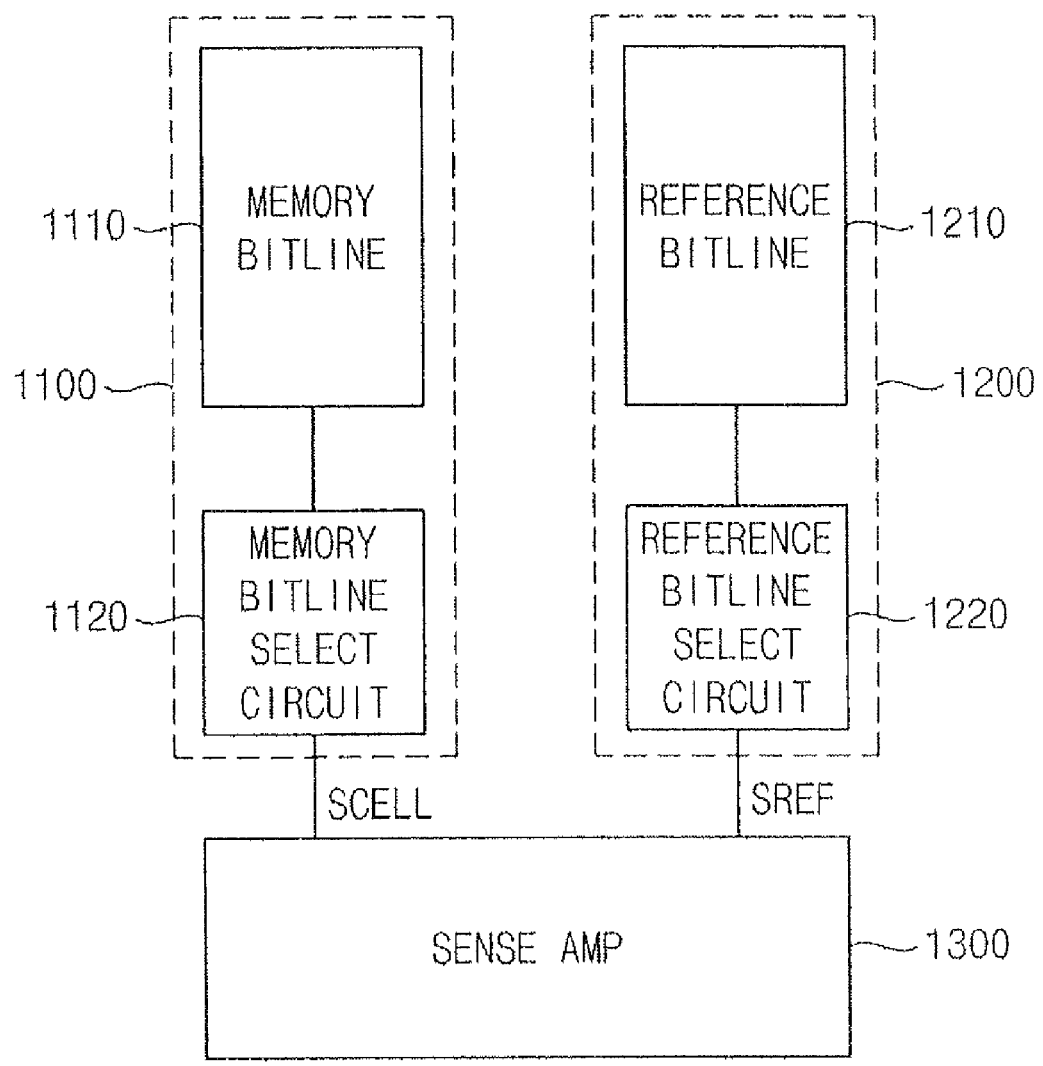
FIG. 1 is a block diagram illustrating a memory device according to some embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present invention. In addition, as used herein, the singular forms "a", "an" and "the" are intended to include the plural forms as well, unless the context clearly indicates otherwise. It also will be understood that, as used herein, the term "comprising" or "comprises" is open-ended, and includes one or more stated elements, steps and/or functions without precluding one or more unstated elements, steps and/or functions. The term "and/or" includes any and all combinations of one or more of the associated listed items.

It will also be understood that when an element is referred to as being "connected" to another element, it can be directly connected to the other element or intervening elements may be present. In contrast, when an element is referred to as being "directly connected" to another element, there are no intervening elements present. It will also be understood that the sizes and relative orientations of the illustrated elements are not shown to scale, and in some instances they have been exaggerated for purposes of explanation. Like numbers refer to like elements throughout.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein. The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art.

It should be construed that forgoing general illustrations and following detailed descriptions are exemplified and an additional explanation of claimed inventions is provided.

Reference numerals are indicated in detail in some embodiments of the present invention, and their examples are represented in reference drawings. Throughout the drawings, like reference numerals are used for referring to the same or similar elements in the description and drawings.

Reference is now made to FIG. 1, which is a block diagram illustrating a memory device according to some embodiments of the present invention. Some embodiments provide that a memory device 1000 includes a memory block 1100, a reference block 1200, and a sense amplifier 1300.

The memory block 1100 selects one of a plurality of memory bit lines 1110 and provides a cell signal SCELL corresponding to a logic value stored in a memory cell connected to the selected bit line.

The memory block 1100 includes a plurality of memory bit lines 1110 connected to a plurality of memory cells, and a memory bit line selection circuit 1120 that selects one of the plurality of memory bit lines 1110. The plurality of memory bit lines 1110 may include a first pattern and a second pattern (Refer to FIG. 2). The first pattern may have a first critical dimension (CD) distribution the second pattern may have a second CD distribution. Here, the CD denotes predetermined tolerances of linewidths and spaces between the memory bit lines. The first pattern may be formed through a first exposure process of a double patterning process and the second pattern may be formed through a second exposure process of the double patterning process. The first pattern may be different from the second pattern, and the first CD distribution may be different from the second CD distribution. In this regard, the first pattern may have first electrical properties, e.g., capacitance, resistance, and so forth, and the second pattern may have second electrical properties different from the first electrical properties.

The reference block 1200 selects a reference bit line having a same pattern as a selected memory bit line, and provides a reference signal SREF based on a connection of a reference cells connected to the selected reference bit line.

The reference block 1200 includes a plurality of reference bit lines 1210 connected to a plurality of reference cells, and a reference bit line selection circuit 1220 that selects one of the plurality of reference bit lines 1210. The reference bit line selection circuit 1220 provides the reference signal SREF by selecting a reference bit line having a same pattern as a selected memory bit line connected to the memory cell to be read. The reference bit lines 1210 include the first pattern and the second pattern.

The sense amplifier 1300 compares the cell signal SCELL with the reference signal SREF and determines the logic value stored in the memory cell. The sense amplifier 1300 may be a current sense amplifier and/or a voltage sense amplifier.

Figure 2:
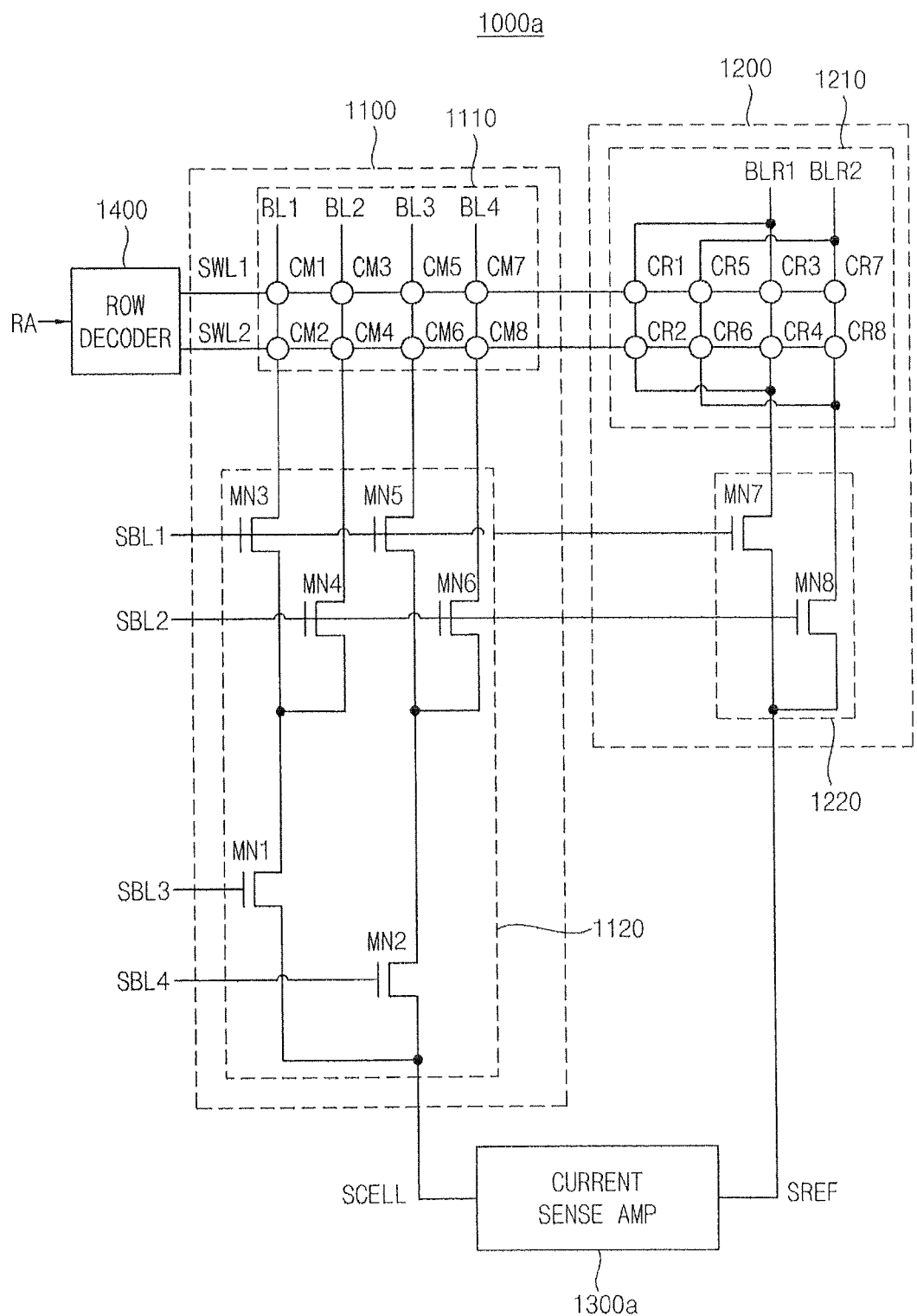
FIG. 2 is a diagram illustrating the memory device of FIG. 1 according to some embodiments of the present invention.

Reference is now made to FIG. 2, which is a diagram illustrating the memory device 1000 of FIG. 1 according to some embodiments of the present invention. Some embodiments provide that a memory device 1000a includes the memory block 1100, the reference block 1200 and a current sense amplifier 1300a. The memory device 1000a may further include a row decoder 1400 that decodes a row address signal RA and selects one row, i.e., one word line.

The memory block 1100 may include the plurality of memory bit lines 1110 connected to a plurality of memory cells CM1~CM8, and the memory bit line selection circuit 1120 that selects one of the plurality of memory bit lines 1110.

The plurality of memory cells CM1~CM8 may be formed through a single patterning process and/or a double patterning process. Each of the memory cells CM1~CM8 may be set to have one of a plurality of resistances, and store a logic value corresponding to the set resistance. The memory cells CM1~CM8 may employ various memory devices that store different logic values using resistive characteristics. Some of the memory cells CM1~CM8 may be selected by word line selection signals SWL1 and SWL2 and bit line selection signals SBL1~SBL4, and each of the selected memory cells may be set to have one of a plurality of resistances in response to a magnetic field that is externally applied. In addition, each of the selected memory cells may be set to have one of a plurality of resistances using a phase-change characteristic. Each of the memory cells CM1~CM8 may store a respective logic value corresponding to a respective resistance. For example, each of the memory cells CM1~CM8 may set or programmed to have one of a first resistance and a second resistance, and a memory cell may store a first logic value, when the memory cell is set to have the first resistance. A memory cell may store a second logic value, when the memory cell is set to have the second resistance. In addition, the memory cell may store the first logic value, when the memory cell is set to have relatively low one of resistances that are capable of being implemented by process, and the memory cell may store the second logic value, when the memory cell is set to have relatively high one of resistances that are capable of being implemented by process.

Some embodiments provide that the plurality of memory cells CM1~CM8 may be arranged in a column formation in an integrated circuit, and may be connected to a plurality of memory bit lines BL1~BL4. The memory bit lines BL1~BL4 may include the first pattern and the second pattern. The first pattern may have the first CD distribution the second pattern may have the second CD distribution. The first pattern may be formed through the first exposure process of the double patterning process and the second pattern may be formed through the second exposure process of the double patterning process. That is, some of the memory bit lines BL1~BL4 may be formed through the first exposure process of the double patterning process, and others of the memory bit lines BL1~BL4 may be formed through the second exposure process of the double patterning process. When the double patterning process is employed for reducing the CD of the memory device 1000a, a pair of adjacent bit lines may be formed through different exposure process of the double patterning process. For example, in some embodiments, odd-numbered memory bit lines BL1 and BL3 may be formed through the first exposure process, and then, even-numbered memory bit lines BL2 and BL4 may be formed through the second exposure process. That is, the odd-numbered memory bit lines BL1 and BL3 may have the first pattern and the even-numbered memory bit lines BL2 and BL4 may have the second pattern. Therefore, the odd-numbered memory bit lines BL1 and BL3 may have the first CD distribution and the even-numbered memory bit lines BL2 and BL4 may have the second CD distribution that is different from the first CD distribution.

The memory bit line selection circuit 1120 includes a plurality of transistors MN1~MN6. The memory bit line selection circuit 1120 selects a memory bit line that is connected to at least one memory cell to be read or to be written of the memory cells CM1~CM8. The memory bit line selection circuit 1120 selects some of the memory bit lines BL1~BL4 in response to the bit line selection signals SBL1~SBL4. The cell signal SCELL is the current signal provided to the current sense amplifier 1300a and corresponds to a logic value stored in the memory cell to be read.

The bit line selection signals SBL1~SBL4 may include global bit line selection signals SBL3 and SBL4 and local bit line selection signals SBL1 and SBL2.

The transistors MN1 and NM2 select one pair of a plurality pairs of adjacent memory bit lines in response to the global bit line selection signals SBL3 and SBL4. That is, the transistors MN1 and NM2 may select one of the odd-numbered memory bit lines and an adjacent one of the even-numbered memory bit lines.

The transistors MN3~MN6 select one of a pair of adjacent memory bit lines in response to the local bit line selection signals SBL1 and SBL2. That is, the transistors MN3~MN6 may select one of the pair of adjacent memory bit lines that include the first pattern and the second pattern in response to the local bit line selection signals SBL1 and SBL2.

The reference block 1200 includes the plurality of the reference bit lines 1210 and the reference bit line selection circuit 1220.

The plurality of the reference bit lines 1210 are connected to a plurality of reference cells CR1~CR8. The plurality of reference cells CR1~CR8 may be formed through a single patterning process and/or a double patterning process. The plurality of reference cells CR1~CR8 may generate the reference signal SREF for reading the plurality of memory cells CM1~CM8 by using resistive characteristics that are similar to those of the plurality of memory cells CM1~CM8.

Each of the reference cells CR1~CR8 may be set to have one of a plurality of resistances and may generate various reference signals according to the set resistance. Each of the plurality of memory cells CM1~CM8 may repeatedly store a corresponding logic value, whereas each of the reference cells CR1~CR8 may store a fixed logic value that is initially set.

The reference cells CR1~CR8 may employ various memory devices that are capable of changing resistive characteristics as the memory cells CM1~CM8. Some of the reference cells CR1~CR8 may be selected by the word line selection signals SWL1 and SWL2 and the bit line selection signals SBL1~SBL4. Each of the selected reference cells may be set to have one of a plurality of resistances in response to a magnetic field that is externally applied. The reference signal may be adjusted by the resistances set to the reference cells CR1~CR8 and a connection of the reference cells CR1~CR8.

The reference bit lines may include the first pattern and the second pattern. The first pattern may have the first CD distribution the second pattern may have the second CD distribution. The first pattern may be formed through the first exposure process of the double patterning process and the second pattern may be formed through the second exposure process of the double patterning process. The reference bit lines may include at least two reference bit lines including a first reference bit line BLR1 and a second reference bit line BLR2.

For example, the first reference bit line BLR1 may be formed through the first exposure process, and then, the second reference bit line BLR2 may be formed through the second exposure process.

The reference bit line selection circuit 1220 includes transistors MN7 and MN8. The reference bit line selection circuit 1220 provides the reference signal SREF by selecting a reference bit line having the same pattern as a selected memory bit line connected to a memory cell to be read when a read operation is performed. The reference bit line selection circuit 1220 selects one of the reference bit lines BLR and BLR2 in response to the bit line selection signals SBL1~SBL4. Some embodiments provide that all of the bit line selection signals SBL1~SBL4 may be used for selecting one of the reference bit lines BLR and BLR2 and some SBL1 and SBL2 of the bit line selection signals SBL1~SBL4 may be used for selecting one of the reference bit lines BLR and BLR2. The bit line selection signals SBL1~SBL4 may include the global bit line selection signals SBL3 and SBL4 and the local bit line selection signals SBL1 and SBL2. The reference bit line selection circuit 1220 may select one of the reference bit lines BLR and BLR2 in response to the local bit line selection signals SBL1 and SBL2.

The transistors MN7 and MN8 selectively activate one of the reference bit lines BLR1 and BLR2 in response to the local bit line selection signals SBL1 and SBL2.

The current sense amplifier 1300a compares the reference signal SREF and the cell signal SCELL corresponding to the logic value stored in the memory cell in the memory block 1100.

Hereinafter, there is a detailed description of the reference bit line selection circuit 1220 with reference to FIG. 2 describing some embodiments in which the odd-numbered memory bit lines BL1 and BL3 and the first reference bit line BLR1 have the first pattern and the even-numbered memory bit lines BL2 and BL4 and the second reference bit line BLR2 have the second pattern. That is, the odd-numbered memory bit lines BL1 and BL3 and the first reference bit line BLR1 have the first CD distribution because the odd-numbered memory bit lines BL1 and BL3 and the first reference bit line BLR1 are formed through the first exposure process and the even-numbered memory bit lines BL2 and BL4 and the second reference bit line BLR2 have the second CD distribution because the even-numbered memory bit lines BL2 and BL4 and the second reference bit line BLR are formed through the second exposure process.

When reading operation is performed on one memory cell CM1 of the memory cells CM1, CM2, CM5 and CM6 that are connected to the odd-numbered memory bit lines BL1 and BL3, the memory device 1000a selects the memory cell CM1 to be read in response to the word line selection signals SWL1 and SWL2 and the bit line selection signals SBL1~SBL4. The memory bit line selection circuit 1120 selects the memory bit line BL1 that is connected to the memory cell CM1 to be read. More particularly, the pair of adjacent memory bit lines BL1 and BL2 are selected in response to the global bit line selection signals SBL3 and SBL4 and the odd-numbered memory bit line BL1 of the pair of adjacent memory bit lines BL1 and BL2 in response to the local bit line selection signals SBL1 and SBL2.

Since the memory bit line BL1 connected to the memory cell CM1 to be read has the first pattern, the reference bit line selection circuit 1220 selects the first reference bit line BLR1 having the first pattern of the reference bit lines BLR1 and BLR2.

Transistor MN7 in the reference bit line selection circuit 1220 activates the first reference bit line BLR1 in response to the local bit line selection signal SBL1, and provides the reference signal SREF to the current sense amplifier 1300a. Transistor MN8 in the reference bit line selection circuit 1220 deactivates the second reference bit line BLR2 in response to the local bit line selection signal SBL2.

The reference signal SREF is generated in the reference cells CR1~CR4, which are connected to the first reference bit line BLR1. The generated reference signal SREF is provided to the current sense amplifier 1300a through the first reference bit line BLR1, which is selected by the reference bit line selection circuit 1220.

As illustrated with reference to FIG. 2, the reference bit line BLR1 may be connected to at least four reference cells (i.e., the reference cells CR1~CR4) and the reference cells CR1~CR4 may be selected in response to the word line selection signals SWL1 and SWL2 and the bit line selection signals SBL1~SBL4.

When a reading operation is performed on one memory cell CM3 of the memory cells CM3, CM4, CM7 and CM8, which are connected to the even-numbered memory bit lines BL2 and BL4, the memory device 1000a selects the memory cell CM1 to be read in response to the word line selection signals SWL1 and SWL2 and the bit line selection signals SBL1~SBL4. The memory bit line selection circuit 1120 selects the memory bit line BL2, which is connected to the memory cell CM3 to be read. More particularly, the pair of adjacent memory bit lines BL1 and BL2 are selected in response to the global bit line selection signals SBL3 and SBL4, and the even-numbered memory bit line BL2 of the pair of adjacent memory bit lines BL1 and BL2 in response to the local bit line selection signals SBL1 and SBL2.

Since the memory bit line BL2 connected to the memory cell CM3 to be read has the second pattern, the reference bit line selection circuit 1220 selects the second reference bit line BLR2 having the second pattern of the reference bit lines BLR1 and BLR2.

Transistor MN7 in the reference bit line selection circuit 1220 deactivates the first reference bit line BLR1 in response to the local bit line selection signal SBL1. Transistor MN8 in the reference bit line selection circuit 1220 activates the second reference bit line BLR2 in response to the local bit line selection signal SBL2, and provides the reference signal SREF to the current sense amplifier 1300a.

The reference signal SREF is generated in the reference cells CR5~CR8, which are connected to the second reference bit line BLR2, and the generated reference signal SREF is provided to the current sense amplifier 1300a through the second reference bit line BLR2, which is selected by the reference bit line selection circuit 1220.

Figure 3:
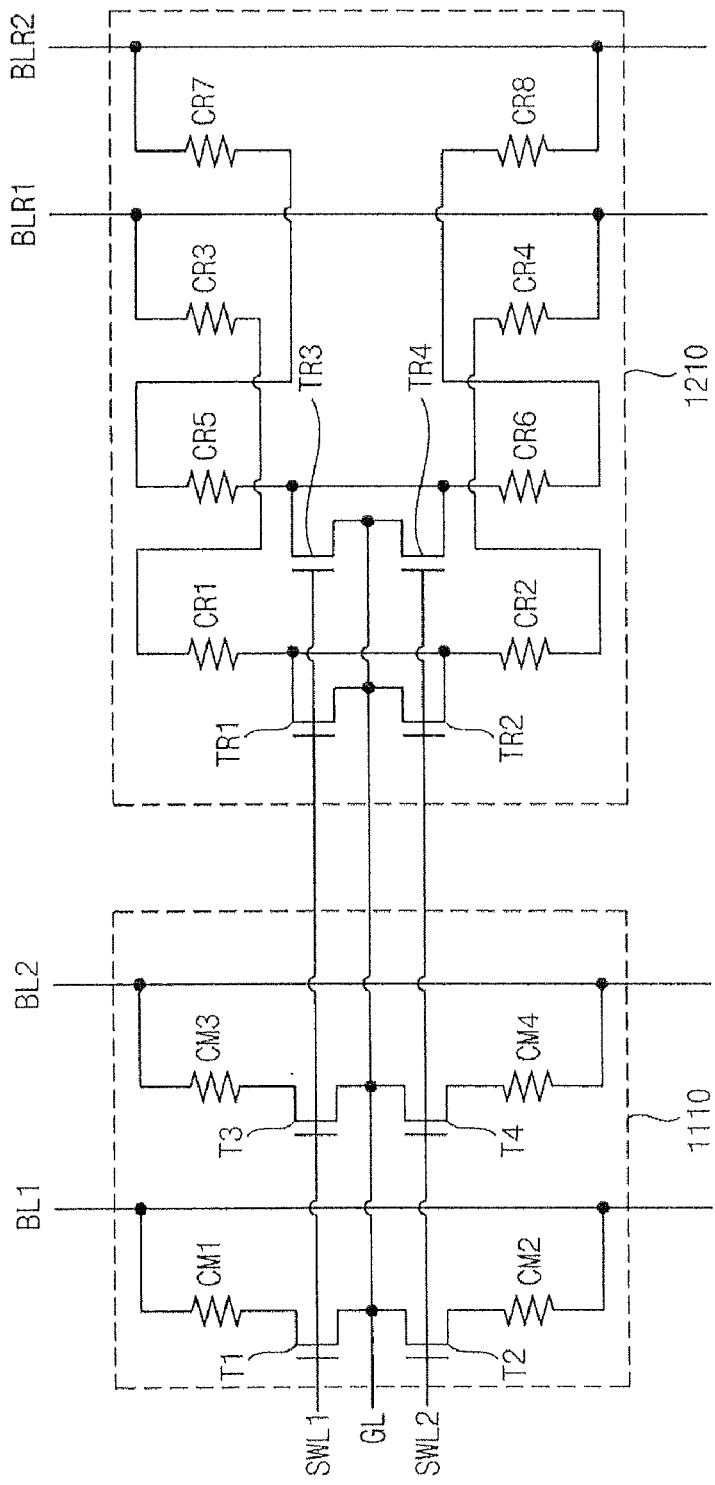
FIG. 3 illustrates connections of the cells and the bit lines of FIG. 2

Reference is now made to FIG. 3, which illustrates connections of the cells and the bit lines of FIG. 2. In some embodiments, the memory bit lines 1110 are connected to the memory cells CM1~CM4. Each of the memory cells CM1~CM4 may be accessed by each of access transistors T1~T4. Each of the access transistors T1~T4 is connected between a ground line GL and each of the memory cells CM1~CM4, and each of the access transistors T1~T4 may be turned on/off in response to the word line selection signals SWL1 and SWL2.

The reference bit lines BLR1 and BLR2 are connected to the reference cells CR1~CR8. The reference bit line BLR1 is connected to the four reference cells (i.e., the reference cells CR1~CR4) and the reference bit line BLR2 is connected to the four reference cells (i.e., the reference cells CR5~CR8.)

The reference cells CR1~CR4 may be accessed by first and second reference access transistors TR1 and TR2, which receive the word line selection signals SWL1 and SWL2, and the reference cells CR5~CR8 may be accessed by third and fourth reference access transistors TR3 and TR4, which receive the word line selection signals SWL1 and SWL2.

When a reading operation is performed on the memory cells CM1 and CM2, which are connected to the odd-numbered memory bit line BL1 having the first pattern, the first reference bit line BLR1 having the first pattern is selected, and the reference signal SREF generated in the reference cells CR1~CR4 is provided to the sense amplifier.

When a reading operation is performed on the memory cells CM3 and CM4, which are connected to the even-numbered memory bit line BL2 having the second pattern, the second reference bit line BLR2 having the second pattern is selected, and the reference signal SREF generated in the reference cells CR5~CR8 is provided to the sense amplifier.

Figure 4A:
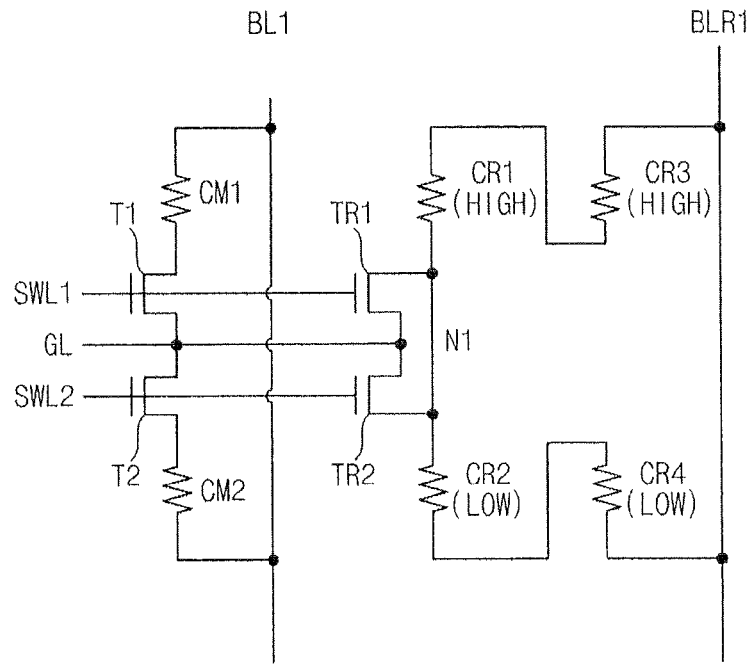
FIGS. 4A and 4B illustrate the memory bit line and the reference bit line having the same pattern in FIG. 3.
Figure 4B:
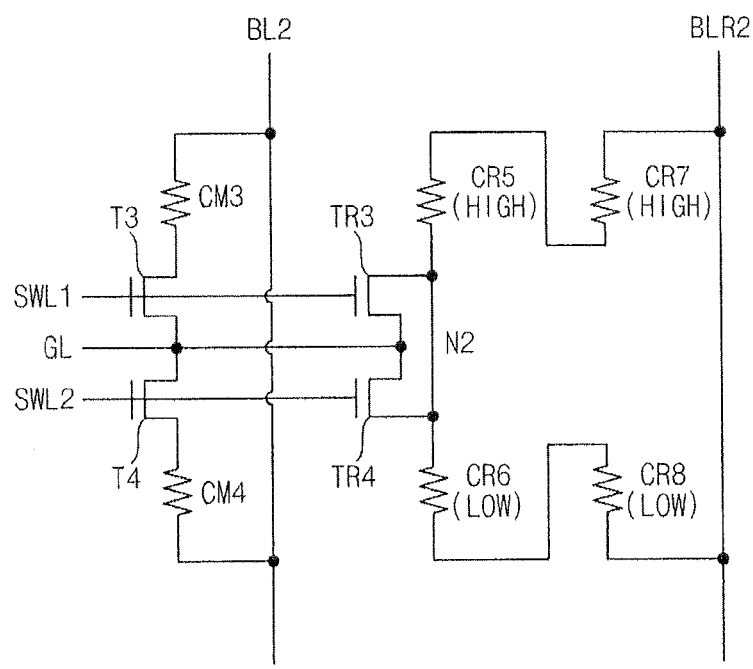

Reference is now made to FIGS. 4A and 4B, which illustrate the memory bit line and the reference bit line having the same pattern in FIG. 3. FIG. 4A illustrates the memory bit line and the reference bit line having the first pattern. In some embodiments, the first and third reference cells CR1 and CR3 are connected in series between a first node N1 and the first reference bit line BLR1. The second and fourth reference cells CR2 and CR4 are connected in series between the first node N1 and the first reference bit line BLR1. The first access transistor TR1 is connected between the first node N1 and the ground line GL. The first access transistor TR1 receives the first word line selection signal SWL1 of the word line selection signals SWL1 and SWL2. The second access transistor TR2 is connected between the first node N1 and the ground line GL. The second access transistor TR2 receives the second word line selection signal SWL2 of the word line selection signals SWL1 and SWL2.

The first and third reference cells CR1 and CR3 may be set to have resistance corresponding to a logic high level and the second and fourth reference cells CR2 and CR4 may be set to have resistance corresponding to a logic low level.

The first memory cell CM1 is connected between the first memory access transistor T1 and the first memory bit line BL1. The second memory cell CM2 is connected between the second memory access transistor T2 and the first memory bit line BL1. The first memory access transistor T1 is connected between the first memory cell CM1 and the ground line GL. The first memory access transistor T1 receives the first word line selection signal SWL1. The second memory access transistor T2 is connected between the second memory cell CM2 and the ground line GL. The second memory access transistor T2 receives the second word line selection signal SWL2.

Hereinafter, there will be a detailed description regarding how the reference signal may be provided when reading a operation is performed on the first and second memory cells with reference to FIG. 4A.

When data stored in the first memory cell CM1 is read, the first word line selection signal SWL1 transitions to a high level, and the first memory access transistor T1 is turned on. The second word line selection signal SWL2 transitions to a low level, and the second memory access transistor T2 is turned off. Therefore, a current path is formed between the ground line GL and the first memory bit line BL, and a current flows through the first memory cell MC1. The reference bit line selection circuit 1120 selects the first reference bit line BLR1 having the same pattern as the first bit line BL1 connected to the memory cell CM1 to be read.

When the first word line selection signal SWL1 transitions to a high level, the first reference access transistor TR1 is turned on, the second word line selection signal SWL2 transitions to a low level, and the fourth reference access transistor TR4 is turned off. Therefore, a current path is formed between the ground line GL and the second reference bit line BLR2, and a current flows through the reference cells CR5~CR8.

The current flowing through the ground line GL may be divided into a first current and a second current. The first current flows from the first reference access transistor TR1 via the first node N1 and the first and third reference cells CR1 and CR3 to the first reference bit line BLR1. The second current flows from the first reference access transistor TR1 via the first node N1 and the second and fourth reference cells CR2 and CR4 to the first reference bit line BLR1. The first and second currents are summed at the first reference bit line BLR1.

When the resistance corresponding to a logic high level set in the first and third reference cells CR1 and CR3 is Rmax, and the resistance corresponding to a logic low level set in the second and fourth reference cells CR2 and CR4 is Rmin, the equivalent resistance of the reference cells CR1~CR4 connected between the ground line GL and the first reference bit line BLR1 is 2(Rmax*Rmin)/(Rmax+Rmin), which is geometric mean of Rmax and Rmin.

A magnitude of the current, flowing through the reference cells CR1~CR4, which are electrically connected with each other, may be between a first magnitude of the current and a second magnitude of the current. The first magnitude of the current is a current that flows through the memory cell to be read when the memory cell to be read has the resistance corresponding to Rmax. The second magnitude of the current is a magnitude of a current that flows through the memory cell to be read when the memory cell to be read has the resistance corresponding to Rmin.

Reference is now made to FIG. 4B, which illustrates the memory bit line and the reference bit line having the second pattern. In some embodiments, the fifth and seventh reference cells CR5 and CR7 are connected in series between a second node N2 and the second reference bit line BLR2. The sixth and eighth reference cells CR6 and CR8 are connected in series between the second node N2 and the second reference bit line BLR2. The third access transistor TR3 is connected between the second node N2 and the ground line GL, and the third access transistor TR3 receives the first word line selection signal SWL1 of the word line selection signals SWL1 and SWL2. The fourth access transistor TR4 is connected between the second node N2 and the ground line GL, and the fourth access transistor TR4 receives the second word line selection signal SWL2 of the word line selection signals SWL1 and SWL2.

The fifth and seventh reference cells CR5 and CR7 may be set to have resistance corresponding to a logic high level and the sixth and eighth reference cells CR6 and CR8 may be set to have resistance corresponding to a logic low level.

The third memory cell CM3 is connected between the third memory access transistor T3 and the second memory bit line BL2. The fourth memory cell CM4 is connected between the fourth memory access transistor T4 and the second memory bit line BL2. The third memory access transistor T3 is connected between the third memory cell CM3 and the ground line GL. The third memory access transistor T3 receives the first word line selection signal SWL1. The fourth memory access transistor T4 is connected between the fourth memory cell CM4 and the ground line GL. The fourth memory access transistor T4 receives the second word line selection signal SWL2.

Hereinafter, there will be a detailed description regarding how a reference signal is provided when reading operation is performed on the third and fourth memory cells with reference to FIG. 4B.

When data stored in the third memory cell CM3 is read, the first word line selection signal SWL1 transitions to a high level, and the third memory access transistor T3 is turned on. The second word line selection signal SWL2 transitions to a low level, and the fourth memory access transistor T4 is turned off. Therefore, a current path is formed between the ground line GL and the second memory bit line BL2, and a current flows through the first memory cell MC1. The reference bit line selection circuit 1120 selects the first reference bit line BLR1 having the same pattern as the first bit line BL1 connected to the memory cell CM1 to be read.

When the first word line selection signal SWL1 transitions to a high level, the third reference access transistor TR3 is turned on, the second word line selection signal SWL2 transitions to a low level, and the second reference access transistor TR2 is turned off. Therefore, a current path is formed between the ground line GL and the first reference bit line BLR1, and a current flows through the reference cells CR1~CR4.

The current flowing through the ground line GL may be divided into a first current and a second current. The first current flows from the third reference access transistor TR3 via the second node N2 and the fifth and seventh reference cells CR5 and CR7 to the second reference bit line BLR2. The second current flows from the third reference access transistor TR3 via the second node N2 and the sixth and eighth reference cells CR6 and CR8 to the second reference bit line BLR2. The first and second currents are summed at the second reference bit line BLR2.

When the resistance corresponding to a logic high level set in the fifth and seventh reference cells CR5 and CR7 is Rmax, and the resistance corresponding to a logic low level set in the sixth and eighth reference cells CR6 and CR8 is Rmin, the equivalent resistance of the reference cells CR5~CR8 connected between the ground line GL and the second reference bit line BLR1 is 2(Rmax*Rmin)/(Rmax+Rmin), which is a geometric mean of Rmax and Rmin.

A magnitude of the current, flowing through the reference cells CR5~CR8, which are electrically connected with each other, may be between a first magnitude of the current and a second magnitude of the current. The first magnitude of the current is a current that flows through the memory cell to be read, when the memory cell to be read has the resistance corresponding to Rmax. The second magnitude of the current is a magnitude of a current that flows through the memory cell to be read, when the memory cell to be read has the resistance corresponding to Rmin.

Figure 5:
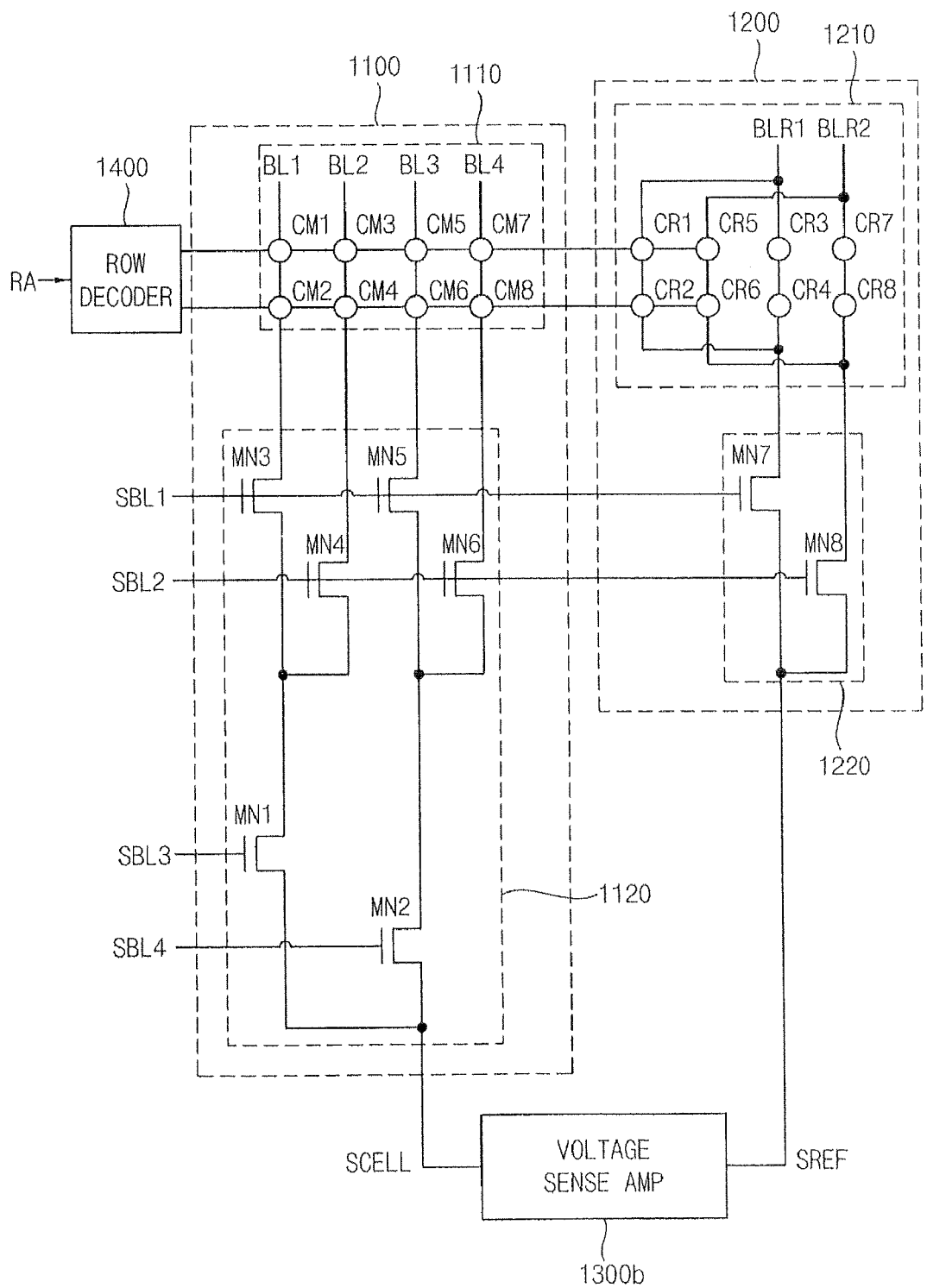
FIG. 5 is a diagram illustrating the memory device of FIG. 1 according to some embodiments of the present invention.

Reference is now made to FIG. 5, which is a diagram illustrating the memory device 1000 of FIG. 1 according to some embodiments of the present invention. A memory device 1000b includes the memory block 1100, the reference block 1200 and a voltage sense amplifier 1300b. The memory device 1000a may further include the row decoder 1400.

The memory device 1000b of FIG. 5 is similar with the memory device 1000a of FIG. 2 except that the memory device 1000b includes the voltage sense amplifier 1300b. The reference bit line selection circuit 1220 provides the reference signal SREF by selecting a reference bit line having the same pattern as a selected memory bit line connected to a memory cell to be read when a read operation is performed.

The voltage sense amplifier 1300b compares the reference signal SREF and the cell signal SCELL corresponding to the logic value stored in the memory cell in the memory block 1100. Therefore, the reference signal SREF may be a voltage signal. Each of the reference cells CR1~CR8 may be set to have one of various resistances according to the reference signal SREF.

Figure 6A:
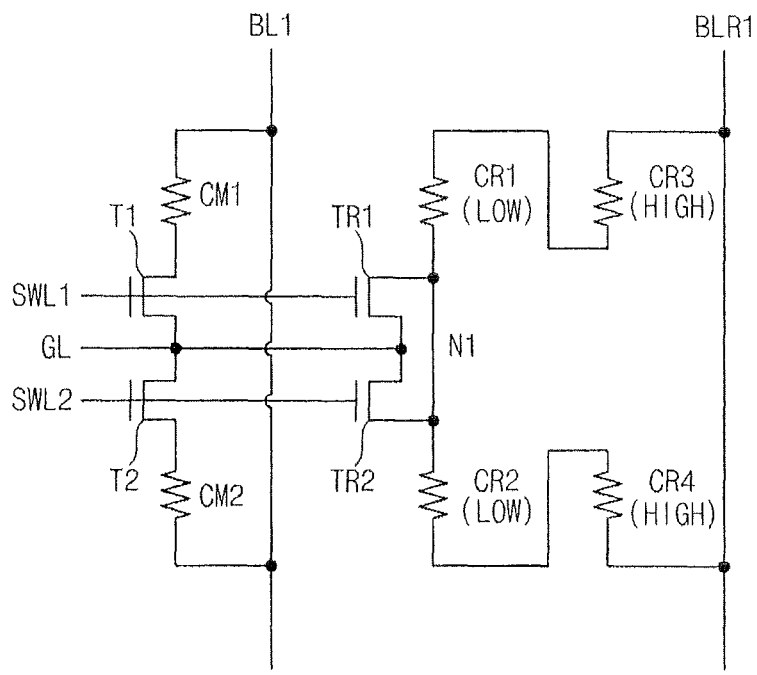
FIGS. 6A and 6B illustrate the memory bit line and the reference bit line having the same pattern in FIG. 5.
Figure 6B:
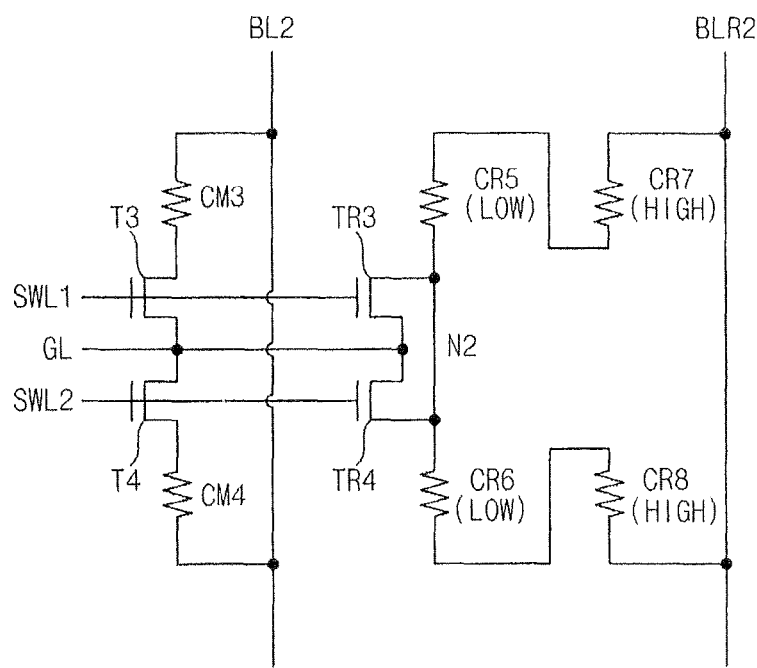

FIGS. 6A and 6B illustrate the memory bit line and the reference bit line having the same pattern in FIG. 5. Referring to FIG. 6A, which illustrates the memory bit line and the reference bit line having the first pattern, the reference cells CR1~CR4 may be set to have different resistances for generating the reference signal SREF, which is the voltage signal from the resistances of the reference cells CR1~CR4 of FIG. 4A. In this manner, the reference signal SREF, which is the current signal, may be generated.

The first and second reference cells CR1 and CR2 may be set to have resistance corresponding to a logic low level and the third and fourth reference cells CR3 and CR4 may be set to have resistance corresponding to a logic high level.

When a reading operation is performed on the first memory cell CM1 or the second memory cell CM2, a current flowing through the ground line GL may be divided into a first current and a second current. The first current flows from the first reference access transistor TR1 via the first node N1 and the first and third reference cells CR1 and CR3 to the first reference bit line BLR1. The second current flows from the first reference access transistor TR1 via the first node N1 and the second and fourth reference cells CR2 and CR4 to the first reference bit line BLR1. The first and second currents are summed at the first reference bit line BLR1.

When the resistance corresponding to a logic high level set in the third and fourth reference cells CR3 and CR4 is Rmax, and the resistance corresponding to a logic low level set in the first and second reference cells CR1 and CR2 is Rmin, the equivalent resistance of the reference cells CR1~CR4 connected between the ground line GL and the second reference bit line BLR2 is (Rmax+Rmin)/2, which is an arithmetical mean of Rmax and Rmin.

A magnitude of the voltage, measured between two points of the reference cells CR1~CR4, which are electrically connected with each other, may be an intermediate voltage between a first magnitude of the voltage and a second magnitude of the voltage. The first magnitude of the voltage is a magnitude of a voltage of the memory cell to be read, when the memory cell to be read has the resistance corresponding to Rmax. The second magnitude of the voltage is a magnitude of a voltage of the memory cell to be read, when the memory cell to be read has the resistance corresponding to Rmin.

Reference is now made to FIG. 6B, which illustrates the memory bit line and the reference bit line having the second pattern. The reference cells CR5~CR8 may be set to have different resistances for generating the reference signal SREF, which is the voltage signal from the resistances of the reference cells CR1~CR4 of FIG. 4B. In this manner, the reference signal SREF, which is the current signal, may be generated.

The fifth and sixth reference cells CR5 and CR6 may be set to have resistance corresponding to a logic low level, and the seventh and eighth reference cells CR7 and CR8 may be set to have resistance corresponding to a logic high level.

When a reading operation is performed on the third memory cell CM3 or the fourth memory cell CM4, a current flowing through the ground line GL may be divided into a first current and a second current. The first current flows from the third reference access transistor TR3 via the second node N2 and the fifth and seventh reference cells CR5 and CR7 to the second reference bit line BLR2. The second current flows from the third reference access transistor TR3 via the second node N2 and the sixth and eighth reference cells CR6 and CR8 to the second reference bit line BLR2. The first and second currents are summed at the second reference bit line BLR2.

When the resistance corresponding to a logic high level set in the seventh and eighth reference cells CR7 and CR8 is Rmax and the resistance corresponding to a logic low level set in the fifth and sixth reference cells CR5 and CR6 is Rmin, the equivalent resistance of the reference cells CR1~CR4 connected between the ground line GL and the second reference bit line BLR2 is (Rmax+Rmin)/2, which is an arithmetical mean of Rmax and Rmin.

A magnitude of the voltage, measured between two points of the reference cells CR5~CR8, which are electrically connected with each other, may be an intermediate value between a first magnitude of the voltage and a second magnitude of the voltage. The first magnitude of the voltage is a magnitude of a voltage of the memory cell to be read when the memory cell to be read has the resistance corresponding to Rmax. The second magnitude of the voltage is a magnitude of a voltage of the memory cell to be read when the memory cell to be read has the resistance corresponding to Rmin.

When a read operation is performed on the memory cell, the equivalent resistance of the reference cells that are electrically connected to each other may be an intermediate resistance of the resistances of the reference cells. The intermediate resistance may be a geometric mean or an arithmetical mean according to the kind of the sense amplifier. For example, when the current sense amplifier is used as illustrated in FIGS. 2, 4A and 4B, the intermediate value may be the geometric mean of the resistances of the reference cells. For example, when the voltage sense amplifier is used as illustrated in FIGS. 5, 6A and 6B, the intermediate value may be the arithmetical mean of the resistances of the reference cells.

Figure 7A:
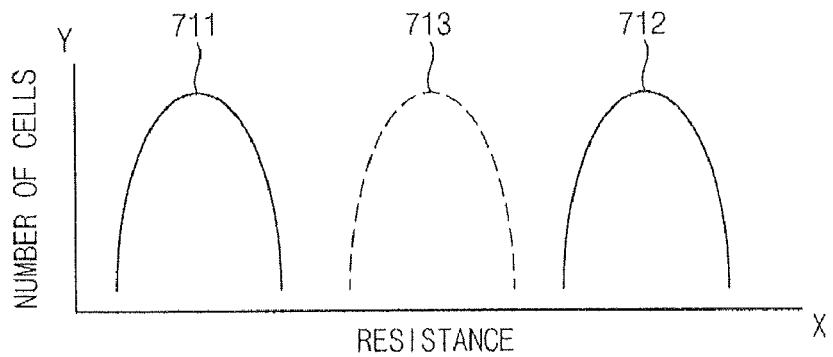
FIGS. 7A and 7B illustrates resistance distributions of a memory block and a reference block of a memory device according to the conventional art
Figure 7B:
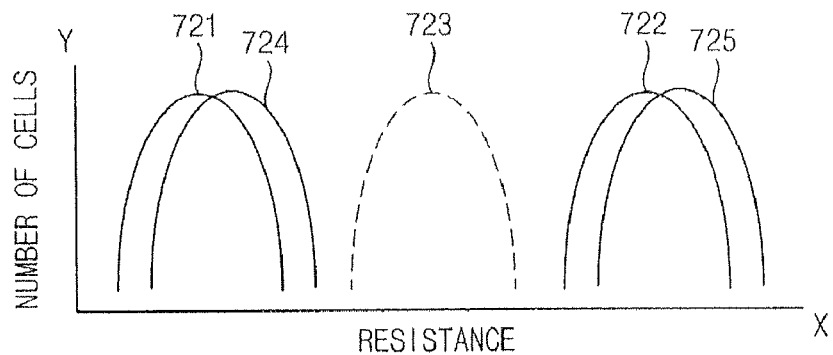
Figure 7C:
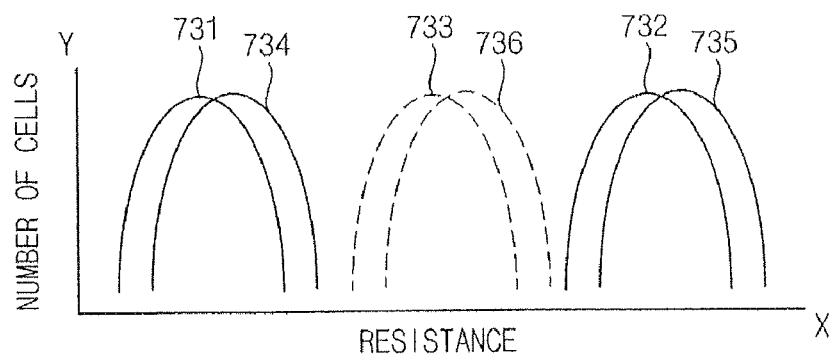
FIG. 7C illustrates resistance distributions of the memory block and the reference block of the memory device according to some embodiments of the present invention.

FIGS. 7A and 7B illustrate resistance distributions of a memory block and a reference block of a memory device, respectively, according to the conventional art. FIG. 7C illustrates resistance distributions of the memory block and the reference block of the memory device according to some embodiments of the present invention.

In FIGS. 7A to 7C, X axis denotes resistances, and Y axis denotes a number of memory bit lines and memory cells that are connected with respect to each other and a number of reference bit lines and reference cells that are connected with respect to each other.

Referring to FIG. 7A, in the memory device which is formed through the single patterning process, a resistance distribution 713 of the reference block is placed between a resistance distribution 711 of a memory block set to have a resistance corresponding to a first logic level and a resistance distribution 712 of a memory block set to have a resistance corresponding to a second logic level. Therefore, it is determined that the data stored in the memory block is the first logic level or the second logic level by comparing the resistances of the reference block and the memory block.

FIG. 7B is a diagram illustrating resistance distributions of the memory device which is formed through the double patterning process. Referring to FIG. 7B, resistance distributions 721 and 724 of the memory block set to have a resistance corresponding to the first logic level may be shifted according to the patterning process. That is, the resistance distribution 721 of the memory block including memory bit lines that have the first pattern may be different from the resistance distribution 724 of the memory block including memory bit lines that has the second pattern. In addition, resistance distributions 722 and 725 of the memory block set to have a resistance corresponding to the first logic level may be shifted according to the patterning process. That is, the resistance distributions 721 and 722 of the memory block including memory bit lines that have the first pattern may be different from the resistance distributions 724 and 725 of the memory block including memory bit lines that have the second pattern. In the memory device, which is formed through the double patterning process, a resistance distribution 723 of the reference block is placed between the resistance distributions 721 and 724 of the memory block set to have a resistance corresponding to the first logic level and a resistance distributions 722 and 725 of the memory block set to have a resistance corresponding to the second logic level. Therefore, it is determined that the data stored in the memory block is the first logic level or the second logic level by comparing the resistances of the reference block and the memory block.

When the memory device is formed through the double patterning process as illustrated in FIG. 7B, a sensing margin may be reduced compared with the case when the memory device is formed through the single patterning process as illustrated in FIG. 7A. The sensing margin is a difference of resistances of the memory block and the reference block. In addition, it may be difficult to determine in which direction the resistance distribution of the memory block is shifted.

Reference is now made to FIG. 7C, which is a diagram illustrating resistance distributions of the memory block and the reference block according to some embodiments of the present invention. The resistance distributions 731 and 732 of the memory block including memory bit lines that have the first pattern may be different from the resistance distributions 734 and 735 of the memory block including memory bit lines that have the second pattern as described with reference to FIG. 7B. In addition, since the memory device that is related to FIG. 7C includes reference bit lines formed through the double patterning process, resistance distributions 733 and 736 of the reference block may be shifted according to the patterning process. In general, when the memory bit line of the memory block and the reference bit line of the reference block have the same pattern formed through the same patterning process, resistance distributions of the memory bit line and the reference bit line may be shifted to a same direction. Therefore, when a reading operation is performed on some of the memory cells, the sensing margin may be prevented from being reduced by selecting the reference bit line having the same pattern as the memory bit line connected to the memory cell to be read.

Figure 8:
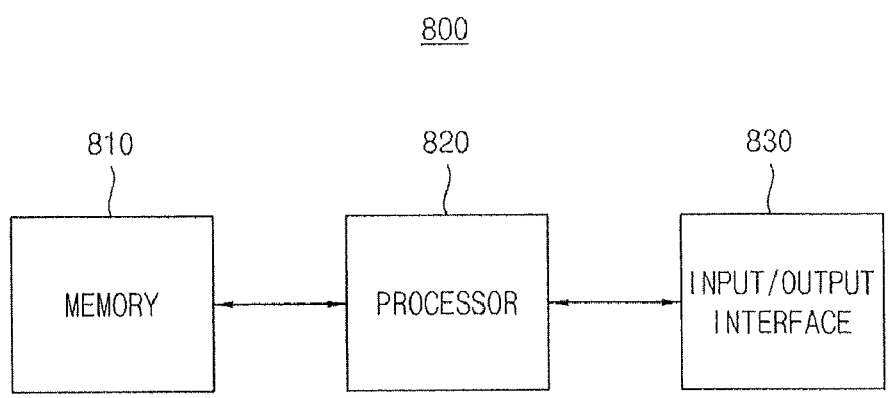
FIG. 8 is a block diagram illustrating a mobile device according to some embodiments of the present invention.

Reference is now made to FIG. 8, which is a block diagram illustrating a mobile device according to some embodiments of the present invention. A mobile device 800 includes a memory device 810, a processor 820 and an input/output interface 830. The input/output interface 830 receives data through input devices such as a keypad and/or a touch screen, and outputs data through output devices such as monitor and/or a speaker. The processor 820 reads data from the memory device 810, processes the read data, and stores the processed data. In addition, the processor 820 provides the input/output interface 830 with the processed data to be output, and transfers the data from the input/output interface 830 to the memory 810.

The memory device 810 of FIG. 8 may employ the memory device 1000a of FIG. 2 and/or the memory device 1000b of FIG. 5. The memory device 810 includes a plurality of memory bit lines having a first pattern and a second pattern, and a plurality of reference bit lines having the first pattern and the second pattern. The first pattern is formed through the first exposure process of the double patterning process, and has a first CD distribution. The second pattern is formed through the second exposure process of the double patterning process and may have a second CD distribution that is different from the first CD distribution. The memory bit lines are connected to a plurality of memory cells, and the reference bit lines are connected to a plurality of reference cells.

Each of the memory cells may be set to have one of a plurality of resistances, and store a logic value corresponding to the set resistance. A reference bit line selection circuit included in the memory device 810 provides the reference signal SREF by selecting a reference bit line having a same pattern as a selected memory bit line connected to the memory cell to be read.

The memory device 810 determines a logic value stored in the memory cell to be read by comparing a reference signal provided from the selected reference bit line with a cell signal corresponding to the data stored in the memory cell to be read, and the cell signal is provided as a current signal and/or a voltage signal.

Figure 9:
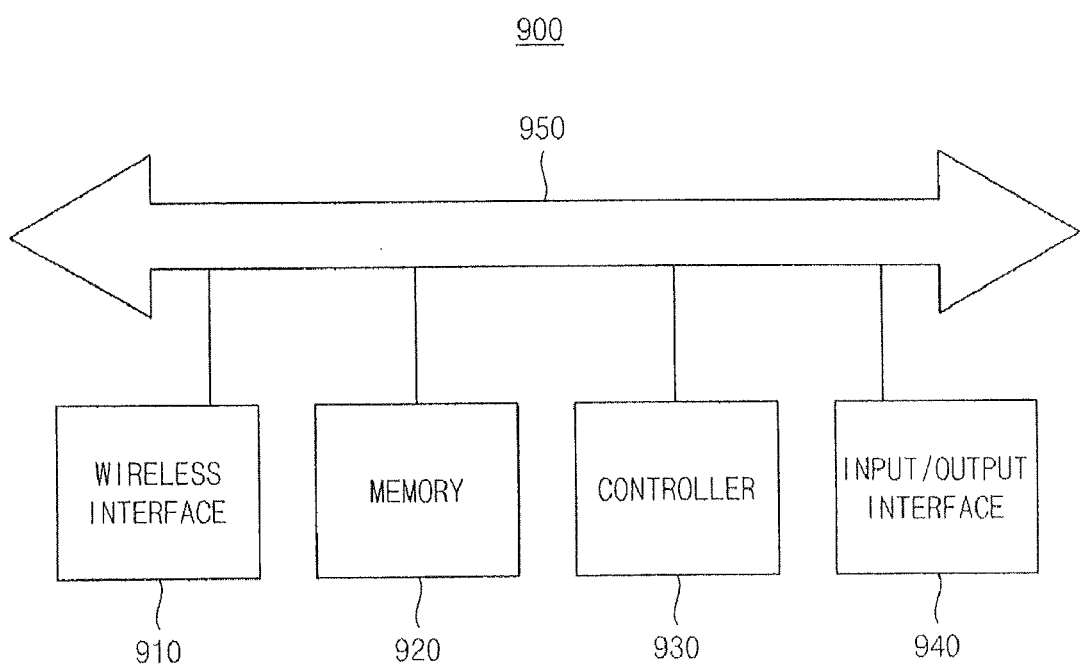
FIG. 9 is a block diagram illustrating a wireless communication device according to some embodiments of the present invention.

Reference is now made to FIG. 9, which is a block diagram illustrating a wireless communication device according to some embodiments of the present invention. A wireless communication device 900 includes a wireless interface 910, a memory device 920 that is a resistive memory device, a controller 930, an input/output interface 940, and a bus 950.

The wireless interface 910 transmits/receives data through a wireless transceiving device such as a wireless transceiver. The resistive memory device stores data. The controller 930 may be a micro-processor and/or a digital signal processor. The controller 930 processes the data, and controls the wireless interface 910, the memory device 920, and the input/output interface 940. The input/output interface 940 receives data through input devices such as a keypad and/or a touch screen, and outputs data through output devices such as monitor and/or a speaker.

The memory device 920 of FIG. 9 may employ the memory device 1000a of FIG. 2 and/or the memory device 1000b of FIG. 5. The memory device 920 includes a plurality of memory bit lines having a first pattern and a second pattern, and a plurality of reference bit lines having the first pattern and the second pattern. The first pattern is formed through the first exposure process of the double patterning process, and has a first CD distribution. The second pattern is formed through the second exposure process of the double patterning process and may have a second CD distribution that is different from the first CD distribution. The memory bit lines are connected to a plurality of memory cells, and the reference bit lines are connected to a plurality of reference cells.

Each of the memory cells may be set to have one of a plurality of resistances, and store a logic value corresponding to the set resistance. A reference bit line selection circuit included in the memory device 920 provides the reference signal SREF by selecting a reference bit line having a same pattern as a selected memory bit line connected to the memory cell to be read.

The memory device 920 determines a logic value stored in the memory cell to be read by comparing a reference signal provided from the selected reference bit line with a cell signal corresponding to the data stored in the memory cell to be read. The cell signal may be provided as a current signal and/or a voltage signal.

As mentioned above, the memory device according to some embodiments herein prevents sensing margins from being reduced by selecting a reference bit line having a same pattern as a selected memory bit line connected to a memory cell to be read. Therefore, the memory device according to example embodiments may be adopted by various memory devices such as Resistive Random Access Memory (RRAM), Magnetroresistrive Random Access Memory (MRAM), and/or Phase-change Random Access Memory (PRAM), which are manufactured through the double patterning process.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the embodiments disclosed herein, and that modifications to the disclosed embodiments, as well as other embodiments, are intended to be included within the scope of the appended claims. The present invention is defined by the following claims.

What is claimed is:

1. A memory device comprising:
a plurality of memory bit lines that are connected to a plurality of memory cells, the memory bit lines having a first pattern and a second pattern, the first pattern having a first critical dimension (CD) distribution, the second pattern having a second CD distribution that is different from the first CD distribution;
a plurality of reference bit lines connected to a plurality of reference cells, the reference bit lines having the first pattern and the second pattern; and
a reference bit line selection circuit that is configured to provide a reference signal by selecting a reference bit line having a same pattern as a selected memory bit line connected to a memory cell to be read when a read operation is performed,
wherein the reference bit line selection circuit includes a plurality of transistors that selectively activate the reference bit line having the same pattern as the selected memory bit line connected to the memory cell to be read, in response to a bit line selection signal when the read operation is performed.

2. The memory device of claim 1, wherein the first pattern is formed through a first exposure process of a double patterning process and the second pattern is formed through a second exposure process of the double patterning process.

3. The memory device of claim 1, wherein the first pattern is different from the second pattern.

4. The memory device of claim 1, wherein each of the memory cells is set to have one of a first plurality of resistances, and each of the reference cells is set to have one of a second plurality of resistances.

5. The memory device of claim 4,
wherein the reference bit line selection circuit provides a current signal or a voltage signal as the reference signal,
wherein the current signal or the voltage signal is generated based on a connection of the reference cells, and
wherein the current signal or the voltage signal has a value corresponding to an intermediate resistance between the resistances.

6. The memory device of claim 1, wherein the plurality of transistors comprises:
a first transistor that activates the reference bit line having the same pattern as the selected memory bit line connected to the memory cell to be read to provide the reference signal, in response to the bit line selection signal; and
a second transistor that deactivates a reference bit line having a different pattern from the selected memory bit line connected to the memory cell to be read, in response to the bit line selection signal.

7. The memory device of claim 1, wherein the plurality of reference bit lines comprises:
a first reference bit line having the first pattern; and
a second reference bit line having the second pattern,
wherein each of the first bit line and the second bit line is connected to at least four reference cells, and
wherein each of the reference cells is set to have one of the plurality of resistances.

8. The memory device of claim 7, wherein the at least four reference cells are connected such that an equivalent resistance of the at least four reference cells corresponds to a mean of the plurality of resistances when the read operation is performed.

9. The memory device of claim 8, wherein the mean comprises an arithmetical mean or a geometric mean.

10. The memory device of claim 1, further comprising:
a sense amplifier configured to compare the reference signal with a cell signal corresponding to a data stored in the memory cell to be read,
wherein the cell signal is provided as a current signal or a voltage signal when the read operation is performed.

11. A resistive memory device, comprising:
a memory block that is configured to select one of a plurality of memory bit lines, and that is configured to provide a cell signal corresponding to a logic value stored in a memory cell connected to the selected bit line, the memory bit lines having a first pattern and a second pattern;
a reference block that is configured to select a reference bit line having a same pattern as a selected memory bit line, and that is configured to provide a reference signal based on a connection of a reference cells connected to the selected reference bit line; and
a sense amplifier that is configured to compare the cell signal with the reference signal and that is configured to determine the logic value stored in the memory cell,
wherein the reference block includes a plurality of reference bit lines connected to the reference cells and a reference bit line selection circuit that is configured to provide the reference signal by selecting the reference bit line having the same pattern as the selected memory bit line connected to a memory cell to be read when a read operation is performed, and
wherein the reference bit line selection circuit includes a plurality of transistors that selectively activate the reference bit line having a same pattern as the selected memory bit line connected to the memory cell to be read, in response to a bit line selection signal when the read operation is performed.

12. The resistive memory device of claim 11,
wherein the first pattern has a first critical dimension (CD) distribution,
wherein the second pattern has a second CD distribution, and
wherein the first pattern is different from the second pattern.

13. A mobile device, comprising:
an input/output interface that inputs/outputs data;
a processor that processes the data; and
a memory device including:
a plurality of memory bit lines, connected to a plurality of memory cells storing the data, the memory bit lines having a first pattern and a second pattern, the first pattern having a first critical dimension (CD) distribution, the second pattern having a second CD distribution that is different from the first CD distribution; and
a plurality of reference bit lines, connected to a plurality of reference cells, the reference bit lines having the first pattern and the second pattern; and
a reference bit line selection circuit that is configured to provide a reference signal by selecting a reference bit line having a same pattern as a selected memory bit line connected to a memory cell to be read when a read operation is performed,
wherein the reference bit line selection circuit includes a plurality of transistors that selectively activate the reference bit line having the same pattern as the selected memory bit line connected to the memory cell to be read, in response to a bit line selection signal when the read operation is performed.

* * * * *